US005401611A

United States Patent [19]

Edwards, Sr. et al.

[11] Patent Number: 5,401,611

[45] Date of Patent: Mar. 28, 1995

[54] HEAT MODE RECORDING MATERIAL AND METHOD FOR MAKING A LITHOGRAPHIC PLATE

[75] Inventors: John W. Edwards, Sr., West Chelmsford, Mass.; Luc Leenders, Herentals, Belgium; Yves Verburgh, Puurs, Belgium; Joan Vermeersch, Deinze, Belgium; Ronald Schuerwegen, Schelle, Belgium

[73] Assignee: AGFA-Gevaert, N.V., Mortsel, Belgium

[21] Appl. No.: 13,729

[22] Filed: Feb. 5, 1993

[51] Int. Cl.[6] .......................... G03C 1/00; G03F 7/00

[52] U.S. Cl. .................................. 430/276; 430/273; 430/275; 430/278; 430/616; 430/617; 430/945; 430/964

[58] Field of Search .............. 430/616, 964, 275, 276, 430/278, 945, 273, 617

[56] References Cited

U.S. PATENT DOCUMENTS

| | | | |
|---|---|---|---|
| 4,278,756 | 7/1981 | Bouldin et al. | 430/616 |
| 4,284,716 | 8/1981 | Drexler et al. | 430/616 |
| 4,314,260 | 2/1982 | Drexler | 430/616 |
| 4,363,870 | 12/1982 | Bouldin | 430/616 |
| 4,465,767 | 8/1984 | Oba et al. | 430/276 |
| 4,563,410 | 1/1986 | De Jaeger et al. | 430/204 |
| 4,753,864 | 6/1988 | Bouldin et al. | 430/616 |

*Primary Examiner*—Richard L. Schilling
*Attorney, Agent, or Firm*—Breiner & Breiner

[57] ABSTRACT

The present invention provides a heat mode recording material comprising on a support having a hydrophilic surface or being provided with a hydrophilic layer, a metallic layer and on top thereof a hydrophobic layer having a thickness of less than 50 nm and there is further provided a method for making a lithographic plate therewith.

2 Claims, No Drawings

HEAT MODE RECORDING MATERIAL AND METHOD FOR MAKING A LITHOGRAPHIC PLATE

DESCRIPTION

1. Field of the Invention

The present invention relates to a heat mode recording material for making a lithographic printing plate for use in lithographic printing. The present invention further relates to a method for imaging said heat mode recording material by means of a laser.

2. Background of the Invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and a greasy ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plates comprise highly ink repellant areas and oleophilic areas. Generally the highly ink repellant areas are formed by a silicon layer.

Wet printing plates can be prepared using a photographic material that is made image-wise receptive or repellant to ink upon photo-exposure of the photographic material. However heat mode recording materials, the surface of which can be made image-wise receptive or repellant to ink upon image-wise exposure to heat and/or subsequent development are also known for preparing wet printing plates.

For example in U.S. Pat. No. 4,034,183 there is comprised a heat mode recording material that has on an anodized aluminium support a hydrophylic layer. The disclosed heat mode recording material is image-wise exposed using a laser and the exposed areas are thereby rendered hydrophobic and thus ink acceptant (oleophilic).

Japanese patent application laid open to public inspection no. 52-37104 discloses an offset printing plate comprising on a support (for example on aluminium, a polyester film, R.C. paper etc) (i) an anodically produced, porous aluminiumoxide layer having a thickness of more than 0.5 nm and (ii) a layer containing cupper, silver, brass or graphite. The surface of the plate is exposed to a laser beam of high energy density to render the exposed areas hydrophylic. An offset printing plate is thus obtained. The disclosed heat mode recording material is of low sensitivity as revealed by the use of a high laser energy, about 1 W , and rather slow writing speed of about 2 m/s.

SUMMARY OF THE INVENTION

It is an object of the present invention to provide an alternative heat mode recording material of high sensitivity and a method for making without any processing a lithographic printing plate of high quality therewith.

Further objects of the present invention will become clear from the description hereinafter.

According to the present invention there is provided a heat mode recording material comprising on a support having a hydrophilic surface or provided with a hydrophilic layer a metallic layer and on top thereof a hydrophobic layer having a thickness of less than 50 nm.

According to the present invention there is provided a method for making a lithographic printing plate comprising image-wise exposing to actinic radiation a heat mode recording material comprising on a support having a hydrophilic surface or provided with a hydrophilic layer a metallic layer and on top thereof a hydrophobic layer having a thickness of less than 50 nm thereby rendering the exposed areas hydrophilic and repellant to greasy ink.

DETAILED DESCRIPTION

It has been found that with the above described heat mode recording material and method of the present invention wet printing plates can be obtained yielding a high printing endurance, high sharpness, and having a high sensitivity.

Metallic layers suitable for use in accordance with the invention are metals converting the actinic radiation to heat so that the hydrophobicity of the hydrophobic top-layer is destroyed. The thickness of the metallic layer is preferably from 0.01 μm to 2 μm, and most preferably from 0.05 μm to 1.5 μm. Specific examples of metal layers are aluminium, bismuth and silver of wich the latter is preferred.

A silver layer for use in this invention as the metallic layer can be made according to the principles of the silver complex diffusion transfer reversal process, hereinafter called DTR-process, having been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

Thus in order to provide a hydrophilic support or a support carrying a hydrophylic layer with a silver layer according to the DTR process, the support is provided with physical development nuclei on the hydrophylic surface or on the hydrophylic layer. Subsequently an unexposed silver halide emulsion layer is brought in water permeable relationship with the physical development nuclei and is developed in the presence of developing agents and silver halide solvents using an aqueous alkaline solution.

The silver layer can be provided on the hydrophilic surface of a support or on a hydrophilic layer on the support using the above described DTR-process according to the following embodiments.

According to a first embodiment the silver halide emulsion layer is provided on a support of an element separate from the support having a hydrophilic surface or carrying a hydrophilic layer (hereinafter hydrophilic element). On the hydrophilic element is provided a physical development nuclei layer and/or the physical development nuclei are incorporated in the hydrophilic layer when present. The element having the silver halide emulsion layer and hydrophilic element are developed in the presence of developing agent(s) and silver halide solvent(s) using an alkaline processing liquid while being in contact with each other. When both elements are subsequently peeled apart, a metallic silver layer is obtained on the hydrophilic element.

According to a second embodiment a hydrophilic element provided with a physical development nuclei layer can be provided with the silver halide emulsion layer. Such element can then be developed in the presence of developing agent(s) and silver halide solvent(s) using an alkaline developing liquid. Subsequent to said development the element is washed with preferably warm water of about 30° C. to 45° C. to remove the now useless emulsion layer and to expose the metallic silver layer formed in the layer containing physical development nuclei.

According to a third embodiment a hydrophilic element may first be provided with a silver halide emulsion layer on which is then provided a layer containing physical development nuclei. After development in the presence of silver halide solvent(s) and developing agent(s) using an alkaline developing liquid a metallic silver layer will be formed on top of the emulsion layer. The silver halide emulsion layer necessarily is hydrophylic so that the silver layer will be formed on a hydrophilic background as required in connection with the present invention.

The image receiving layer containing physical development nuclei used in accordance with the present invention is preferably free of hydrophilic binder but may comprise small amounts upto 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

The photographic silver halide emulsion(s) that can be used in accordance with one of the above described embodiments can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

More details about the composition, preparation and coating of silver halide emulsions can be found in e.g. Product Licensing Index, Vol. 92, December 1971, publication 9232, p. 107–109.

The alkaline processing liquid used in accordance with the above embodiments preferably has a pH between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help providing the pH and serve as a silver halide complexing agent.

The alkaline processing liquid may also contain the developing agent(s). In this case the alkaline processing liquid is called a developer. On the other hand some or all of the developing agent(s) may be present in one or more layers of of the hydrophilic element or of the element containing the silver halide emulsion layer. When none of the developing agents are contained in the alkaline processing liquid the alkaline processing liquid may be called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidlnone, and 1-phenyl-4,4-dimethyl-3-pyrazolidinone. However other developing agents can be used.

The alkaline processing liquid used for developing the silver halide preferably contains a silver halide solvent. Preferably the silver halide solvent is used in an amount between 0.05% by weight and 5% by weight and more preferably between 0.05% by weight and 2% by weight. Suitable silver halide solvents for use in connection with the present invention are e.g. 2-mercaptobenzoic acid, cyclic imides, oxazolidones, thiocyanates and thiosulfates or a meso-ionic compound. Further silver halide solvents that can be used in connection with the present invention are alkanolamines. Alkanolamines that are suitable for use in accordance with the present invention may be of the tertiary, secundary or primary type.

An alternative method for providing a silver metal layer on the hydrophilic support or support carrying a hydrophilic layer has been described in. U.S. Pat. No. 4,278,756, U.S. Pat. No. 4,269,917 and U.S. Pat. No. 4,284,716 whereby a material comprising a silver halide emulsion layer on a hydrophilic support or a support carrying a hydrophilic layer is exposed to a short actinic radiation. The material is developed, rinsed and dried. Afterwards said material is for a short time immersed in a reducing solution and rinsed. Hereby a very thin layer of physically reducing nuclei is formed. After treatment of said material in a DTR-developing solution, a silver layer is formed.

A still further method for providing a metal layer on the hydrophilic support or support carrying a hydrophilic layer a silver halide emulsion disposed on a hydrophilic substrate is strongly exposed to actinic radiation and then developed, or otherwise processed to maximum blackness. The black opaque emulsion is converted to a reflective recording material by heating at least to 270 ° C. in an oxygen containing environment until the emulsion coating assumes a shiny reflective appearance. Such method is disclosed in U.S. Pat. 4,314,260.

According to an alternative method for providing a metal layer on the hydrophilic support or support carrying a hydrophilic layer the metal is provided using vapour or vacuum deposition.

The hydrophobic layer provided on top of the metal layer of the heat mode recording material in connection with the present invention is preferably a monolayer of the hydrophobizing agent. Thus the thickness of the hydrophobic layer will generally be about equal to the size of the hydrophobizing agent. The hydrophobic layer may also consist of multiple layers of the hydrophobizing agent provided the total thickness remains less than 50 nm preferably less than 10 nm. As a consequence a highly sensitive heat mode recording material is obtained. The thin layer of hydrophobizing agents further assures a good differentiation between the ink acceptant and ink repellant areas on the surface of a lithographic printing plate obtained in accordance with the present invention.

Suitable hydrophobizing agents to be used in connection with the present invention are compounds that contain a functionality causing the hydrophobizing agent to adhere to the metallic layer. Such functionalities are groups that either react with the metal layer or that can form a physical bond therewith and that are hydrophobic i.e. insoluble in water or only slightly soluble in water, possibly a micellar system. In case the metal layer is a silver layer these compounds will generally contain a mercapto group or thiolate group and one or more hydrophobic substituents e.g. an alkyl containing at least 3 carbon atoms. Examples of hydrophobizing agents for use in accordance with the present invention are e.g. phenyl mercaptotetrazoles or those described in U.S. Pat. No. 3,776,728, and U.S. Pat. No. 4,563,410. Preferred compounds correspond to one of the following formulas:

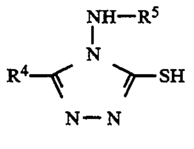

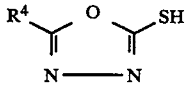

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

The hydrophobic layer may be provided on the metal layer by simply wiping the metal layer with a solution of the hydrophobizing agent, often called fixer as described in e.g. EP-A-483415, EP-A-410500, U.S. Pat. No. 4,062,682 and U.S. Pat. No. 4,563,410.

At the moment the treatment with the fixer is started the metallic layer may be in dry or wet state. In general, the treatment with the fixer does not take long, usually not longer than about 30 seconds and it may be carried out immediately after formation of the metallic layer.

The fixer can be applied in different ways such as by rubbing with a roller, by wiping with an absorbent means e.g. with a plug of cotton or sponge, or by dipping the material to be treated in the fixer. The hydrophobizing treatment may also proceed automatically by conducting the element carrying a metallic layer through a device having a narrow channel filled with the fixer and conveying it at the end of the channel between two squeezing rollers removing the excess of liquid. Suitable devices for automatic treatment with a fixer are the CRF 45 and CRF 85 fixing units, both marketed by AGFA-GEVAERT, Belgium.

In case the metallic layer is silver the hydrophobic layer may be obtained during the formation of the silver layer according to the DTR process. In the latter case the hydrophobizing agents are contained in the alkaline processing liquid preferably in an amount of at least 0.1 g/l, more preferably at least 0.2 g/l and most preferably at least 0.3 g/l. Typically the concentration of hydrophobizing agent is preferably not more than 1.5 g/l and more preferably not more than 1 g/l.

Several types of supports can be used for the manufacturing of a heat mode recording material in accordance with the present invention. These supports, if not sufficiently hydrophilic by themselves, are first coated with a hydrophilic layer to form the hydrophilic background of the printing plate. Supports suitable for use in accordance with the present invention may be opaque or transparent, e.g. a paper support or organic resin support. When a paper support is used, preference is given to one coated at one or both sides with an alpha-olefin polymer, e.g. a polyethylene layer. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-alpha-olefin films such as polyethylene or polypropylene film. The thickness of such organic resin film is preferably comprised between 0.07 and 0.35 mm. Further supports that can be used are metal support such as e.g. aluminium or zinc.

Suitable hydrophilic layers that can be provided on the support and to which a metal layer is then provided are preferably hardened layers e.g. layers containing polyvinyl alcohol and hydrolyzed tetraethyl or tetramethyl orthosilicate and preferably also containing silicium dioxide and/or titanium dioxide as described in e.g. GB-P-1419512, FR-P-2300354, U.S. Pat. Nos. 3,971,660 and 4,284,705, EP-A-450199.

Further suitable hydrophilic layers are the hardened hydrophilic layers of amino-modified dextran or pullulan as disclosed in EP-A-514990.

Still further the hydrophilic layers that can be used are layers containing gelatin. Instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic gelatin containing layers, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. Fast-reacting hardeners such as carbamoylpyridinium salts of the type, described in U.S. Pat. No. 4,063,952 can also be used.

Preferably used hardening agents are of the aldehyde type. The hardening agents can be used in a wide concentration range but are preferably used in an amount of 4% to 7% of weight of the hydrophilic colloid.

A particularly suitable support having a hydrophilic surface is an anodized and roughened aluminium support. Graining of the aluminium surface can be carried out mechanically or electrolytically in any known way. The roughness produced by the graining is measured as a centre line average value expressed in um and preferably varies from about 0.2 to about 1.5 um.

The anodization of the aluminium foil can be performed in electrolytes such as e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 um.

To obtain a lithographic plate according to the method of the present invention the heat mode recording material is image-wise exposed using a laser. Preferably used lasers are e.g. semiconductor lasers, YAG lasers e.g. Nd-YAG lasers, Nd-YLF lasers, Argon lasers etc.. The laser may have a power output between 40 and 7500mW and preferably operates in the infrared part of the spectrum.

As the consequence of the image-wise exposure of the heat mode recording material, the surface of the heat mode material is selectively rendered hydrophilic and repellant to greasy ink, whereas the non exposed areas will remain hydrophobic.

Thus no additional development step is necessary.

The present invention will now be illustrated by the following examples without the intention however to limit the invention thereto. All parts given are by weight unless otherwise stated.

EXAMPLE 1

Preparation of the silver halide emulsion coating solution.

A silver chlorobromide emulsion composed of 98.2mole % of chloride and 1.8mole % of bromide was prepared by the double jet precipitation method. The average silver halide grain size was 0.4 μm (diameter of a sphere with equivalent volume) and contained Rhodium ions as internal dopant. A base layer coating solution was prepared having the following composition:

| | |
|---|---|
| gelatin | 5.5% |
| carbon black | 0.76% |
| silica particles (5 μm) | 1.6% |

Preparation of the heat mode recording material:

The emulsion coating solution and base layer coating solution were simultaneously coated by means of the cascade coating technique to a polyethylene terephthalate support. The emulsion layer was coated such that the silver halide coverage expressed as $AgNO_3$ was $1.5 g/m^2$ and the gelatin content was $1.5 g/m^2$. The emulsion layer further contained $0.15 g/m^2$ of 1-phenyl-4,4'-dimethyl-3-pyrazolidone and $0.25 g/m^2$ of hydroquinone. The base layer was coated such that the amount of gelatin in the coated layer was $3 g/m^2$.

The thus obtained element was dried and subjected to a temperature of 40° C. for 5 days and then the emulsion layer was overcoated with a layer containing PdS as physical development nuclei, hydroquinone at $0.4 g/m^2$ and formaldehyde at $100 mg/m^2$.

The following processing solution was prepared:

| Activator: | |
|---|---|
| sodium hydroxide (g) | 30 |
| sodium sulphite anh. (g) | 33 |
| potassium thiocyanate (g) | 20 |
| 2-mercapto-5-n.heptyl-oxa-3,4-diazole (mg) | 200 |
| water to make | 11 |

The above described element was processed with the above described activator and dried.

A heat mode recording material according to the invention is thus obtained. This material was image-wise exposed using a Nd-Yag laser (1064 nm) at a linear writing speed of 14 m/s, with a spot diameter of 6.5 μm ($1/e^2$) and a power at the surface of the heat mode recording material of 200 mW.

Another heat mode recording material prepared as described above was image-wise exposed using a Nd-YLF laser (1053nm) at a linear writing speed of 32.8 m/s, with a spot diameter of 18 μm ($1/e^2$) and a power at the surface of the heat mode recording material of 1600 mW.

The printing plates thus prepared were mounted on an offset printing machine (Heidelberg GTO-52) and were used to print with a commonly employed ink and the dampening solution described below.

| Dampening solution | | |
|---|---|---|
| water | 880 | ml |
| citric acid | 6 | g |
| boric acid | 8.4 | g |
| sodium sulphate anh. | 25 | g |
| ethyleneglycol | 100 | g |
| colloidal silica | 28 | g |

Of each printing plate more than 10000 copies of excellent quality were obtained.

EXAMPLE 2

A grained and anodized aluminium support was coated with a silver-receptive stratum from a silver sol in water comprising no binder, prepared according to the Carey Lea method, the resulting stratum having a weight in dried condition of 8 mg of silver per $m^2$. A water-swellable intermediate layer was then provided on the dry silver-receptive stratum from an aqeuous composition in such a way that the resulting dried layer had a weight of 0.33 g of polyvinyl alcohol per $m^2$, said composition comprising:

| | |
|---|---|
| 5% aqueous solution of polyvinyl alcohol having a molecular weight of 10,000 and comprising 95 mol % of vinyl alcohol units and 5 mol % of vinyl acetate units | 100 ml |
| Helioechtpapierrot BL (trade mark for a dye sold by BAYER AG, D-5090 Leverkusen, West-Germany) | 15 g |
| saponine | 2.5 g |
| sodium oleylmethyltauride | 1.25 g |
| demineralized water | 205 ml |
| (pH -value: 5.6) | |

Finally a substantially unhardened photosensitive negative-working cadmium-free gelatin silver chlorobromoiodide emulsion layer (97.98/2/0.02 mol %) was provided to the obtained element, the silver halide being provided in an amount corresponding to 2.40 g of silver nitrate per $m^2$ and the gelatin content of the resulting emulsion layer being 1.58 g/$m^2$.

The obtained unexposed monosheet DTR material was immersed for 8 s at 25° C. in a freshly made developing solution having the following ingredients:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 2 g |
| demineralized water to make | 1000 ml |
| pH (25° C.) = 13 | |

The initiated diffusion transfer was allowed to continue for 30 s to form a silver layer on the aluminium support.

To remove the developed silver halide emulsion layer and the swollen intermediate layer from the aluminium foil the developed monosheet DTR materials were rinsed for 30 s with a water jet at 20° C.

The thus obtained metallic silver layer was provided with a hydrophobic layer by guiding the element through a fixer having the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| 2-mercapto-5-n.heptyl-oxa-3,4-diazole | 200 mg |
| sodium hydroxide | 5.5 g |
| water to make | 1000 ml |
| pH (20° C.) = 4 | |

A heat mode recording material according to the invention is thus obtained. This material was image-wise exposed using a Nd-Yag laser (1064 nm) at a linear writing speed of 14 m/s, with a spot diameter of 6.5 μm ($1/e^2$) and a power at the surface of the heat mode recording material of 200 mW.

Another heat mode recording material prepared as described above was image-wise exposed using a Nd-YLF laser (1053nm) at a linear writing speed of 32.8 m/s, with a spot diameter of 18 μm ($1/e^2$) and a power at the surface of the heat mode recording material of 1600 mW. The printing plates thus prepared were mounted on an offset printing machine (Heidelberg GTO-52) and were used to print with a commonly employed ink and fountain solution.

Of each printing plate more than 10000 copies of excellent quality were obtained.

EXAMPLE 3

A poly(ethylene terephtalate) support, carrying a hydrophylic layer was coated with a gelatinous silver halide emulsion having a thickness of 6 μm and a ratio of gelatine to silver halide expressed as $AgNO_3$ of 1.8. The average silver halide grain size was 0.05 μm (diameter of a sphere with equivalent volume).

The thus obtained element was for a short time exposed to actinic radiation and developed in solution A to an optical density of 1.01 (measured by a Mc Bett densitometer through a red filter).

The following developing solution was used

| | |
|---|---|
| $Na_2SO_3$ | 36.9 g |
| Hydroquinone | 7.9 g |
| 1-Phenyl-3-pyrazolidinone | 0.52 g |
| NaOH | 5.3 g |
| NaBr | 2.3 g |
| Benztriazole | 0.07 g |
| Water to make 1 liter | |

After the development the element was rinsed for 5 minutes in cold water and dried on the air. Thereafter the element is slightly fogged on the surface by dipping it during 15 seconds in a solution comprising

| | |
|---|---|
| $KBH_4$ | 0.5 g |
| NaOH | 0.5 g |
| Water to make 1 liter | |

The element was rinsed during 5 minutes with cold water.

The thus obtained element with a very thin, nuclei containing surface layer is then treated for 2 minutes in a solution comprising

| | |
|---|---|
| $Na_2SO_3$ | 5 g |
| Ascorbic acid | 1.25 g |
| p-Monomethyl-aminophenol | 0.125 g |
| NaOH | 2 g |
| NaSCN | 62.5 g |
| Water to make 1 liter | |

After rinsing for 5 minutes in cold water, the thus obtained metallic silver layer was provided with a hydrophobic layer by guiding the element through a fixer having the same composition as in example 2.

A heat mode recording material according to the invention is thus obtained. This material was image-wise exposed using a Nd-Yag laser (1064 nm) at a linear writing speed of 14m/s, with a spot diameter of 6.5 μm ($1/e^2$) and a power at the surface of the heat mode recording material of 200 mW.

Another heat mode recording material prepared as described above was image-wise exposed using a Nd- YLF laser (1053 nm) at a linear writing speed of 32.8m/s, with a spot diameter of 18μm ($1/e^2$) and a power at the surface of the heat mode recording material of 1600 mW. The printing plates thus prepared were mounted on an offset printing machine (Heidelberg GTO-52) and could be used to print with a commonly employed ink and fountain solution.

What is claimed is:

1. A heat mode recording material for making a lithographic printing plate comprising on a support having a hydrophilic surface or being provided with a hydrophilic layer, a layer of metallic silver and on top thereof a hydrophobic layer which adheres to said layer of metallic silver and having a thickness of less than 50 nm, said hydrophobic layer containing a hydrophobizing agent having a mercapto-group and one or more hydrophobic substituents, said hydrophobizing agent corresponds to one of the following formulas:

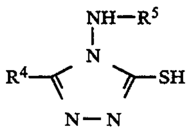

-continued

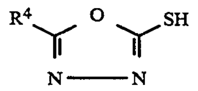

wherein $R^5$ represents hydrogen or an acyl group, $R^4$ represents alkyl, aryl or aralkyl.

2. A heat mode recording material comprising on a support having a hydrophilic surface or being provided with a hydrophilic layer, a metallic layer and on top thereof a hydrophobic layer containing a hydrophobizing agent and having a thickness of less and 50 nm, said hydrophobizing agent corresponding to one of the following formulas:

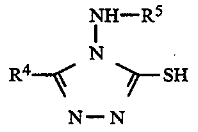

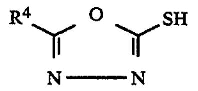

wherein $R^5$ represents a hydrogen or an acyl group, $R^4$ represents alkyl, aryl or aralkyl.

* * * * *